(12) United States Patent
Iravani

(10) Patent No.: US 7,863,991 B1
(45) Date of Patent: Jan. 4, 2011

(54) WIDE RANGE/HIGH SPEED LOW POWER CMOS VCO

(75) Inventor: Kamran Iravani, Los Altos, CA (US)

(73) Assignee: Pico Semiconductor, Inc., Los Altos, CA (US)

( * ) Notice: Subject to any disclaimer, the term of this patent is extended or adjusted under 35 U.S.C. 154(b) by 108 days.

(21) Appl. No.: 12/246,429

(22) Filed: Oct. 6, 2008

(51) Int. Cl.
*H03K 3/03* (2006.01)

(52) U.S. Cl. ..................... 331/57; 331/177 R
(58) Field of Classification Search .............. 331/57, 331/177 R, 34, 175, 185
See application file for complete search history.

(56) References Cited

U.S. PATENT DOCUMENTS

| | | | |
|---|---|---|---|
| 5,559,476 A * | 9/1996 | Zhang et al. | 331/57 |
| 6,469,585 B1 * | 10/2002 | Dai et al. | 331/57 |
| 2007/0200636 A1 * | 8/2007 | Cheruiyot et al. | 331/16 |

* cited by examiner

*Primary Examiner*—Robert Pascal
*Assistant Examiner*—Ryan Johnson

(57) ABSTRACT

A VCO circuit having low jitter and low PSS (power supply sensitivity). The VCO circuit includes a first ring oscillator stage, a second ring oscillator stage coupled to the first ring oscillator stage, and a VCO input coupled to both the first ring oscillator stage and the second ring oscillator stage for receiving a control voltage. Each of the first ring oscillator stage and the second ring oscillator stage further includes a CMOS inverter with a plurality of cross coupled transistors to implement oscillation of the VCO circuit.

17 Claims, 4 Drawing Sheets

WIDE RANGE/HIGH SPEED LOW POWER CMOS VCO

TECHNICAL FIELD

The present invention relates to the field of CMOS technology voltage controlled oscillators and phase-locked loops. More particularly, the present invention relates to a wide range/high speed and low power CMOS voltage controlled oscillator (VCO) for digital communications.

BACKGROUND ART

Voltage controlled oscillators (VCOs) are well known and widely used in the electronics industry. Within the digital communications field, VCOs are used in a variety of applications. Such applications include, for example, frequency synthesizers, clock generation and the like. VCOs are typically designed to perform within a given set of boundary conditions and to perform according to a specified standard. Typical conditions include, for example, performance over operating temperature ranges, sensitivity to noise, output sensitivity to interference, and the like. Typical performance standards include, for example, output signal frequency stability, output signal programmability and the like.

A typical prior art VCO circuit generates an oscillating output signal having a specified frequency. The signal can have several different wave forms (e.g., square, saw tooth, triangular, etc.). The frequency of the output is tunable and is a function of an input voltage, an external resistance or capacitance, or the like. The type of application in which the VCO circuit is used dictates its operating conditions and performance requirements.

In addition, the type of application also largely determines type of fabrication technology used to manufacture the VCO. A large number of modern digital integrated circuits are fabricated using well known and widely used CMOS technology. Where the VCO circuit is included in a CMOS IC (integrated circuit), it is usually fabricated in CMOS (e.g., fabricated using CMOS process technology).

There is a problem, however, when the application in which the overall IC is used requires the VCO circuit to operate at very high speed with low power while maintaining low noise and low PSS (Power Supply Sensitivity). For example, where the IC is part of a high speed serial transmission system (e.g., high speed wireless transmission systems) it is important that the output frequency of the VCO circuit be stable at high frequency, and be a consistent function of the control inputs while the output frequency exhibits very low phase noise.

Consequently, for these very high performance applications it is important that the VCO circuit provide a very stable, low jitter output signal at high frequencies with low power. However, prior art CMOS VCOs cannot reliably function at such high frequencies with low power while maintaining low jitter and low PSS.

Thus, what is required is a CMOS VCO circuit which solves the high speed operation problems of the prior art. What is required is a circuit capable of reliable operation at high frequencies with low power consumption while exhibiting very low phase noise on the output signal. The present invention provides an advantageous solution to the above requirements.

DISCLOSURE OF THE INVENTION

Embodiments of the present invention provide a CMOS VCO circuit which solves the wide range/high speed and low power operation problems of the prior art. The present invention provides circuits capable of reliable operation at high frequencies with low power while exhibiting very low jitter and PSS on the output signal.

In one embodiment, the present invention is implemented as a wide range, high speed and low power CMOS voltage controlled oscillator (VCO) circuit. In this implementation, the VCO circuit is a two stage ring oscillator. The VCO circuit includes a VCO input for receiving a control voltage. A first and a second VCO cell are coupled to each other. Each VCO cell comprises an N-type transistor as a source follower whose gate is connected to the input control voltage. Each VCO cell also includes 4 N-type and 4 P-type transistors which form a complimentary CMOS inverter with 2 cross coupled transistors. The existence of the cross coupled transistors is configured to enable the VCO to oscillate with 2 stages.

The attribute whereby the circuit is based on CMOS technology and comprises only 2 stages, the power dissipation will be low and the speed can cover a wide range, from low up to very high speeds. Also the source follower will improve the PSS significantly. Depending on the applications, the output can be taken from one of the VCO cells or from both. Another variation of this circuit can be implemented by connecting the sources of the N-type source followers.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill, in the art that the present invention may be practiced without these specific details. In other instances, well-known methods, procedures, components, and circuits have not been described in detail as not to unnecessarily obscure aspects of the embodiments of the present invention.

The present invention provides a CMOS PLL circuit which solves the low spurs operation problems of the prior art. The present invention provides a circuit capable of reliable operation while exhibiting very low spurs on the output signal. The circuit of the present invention produces a stable, output signal with a waveform free of defects and irregularities. The present invention and its benefits are described in greater detail below.

The present invention provides a solution which solves the wide range/high speed/low power/low noise problems associated with the prior art. The present invention and its benefits are further described below.

Figure 1:
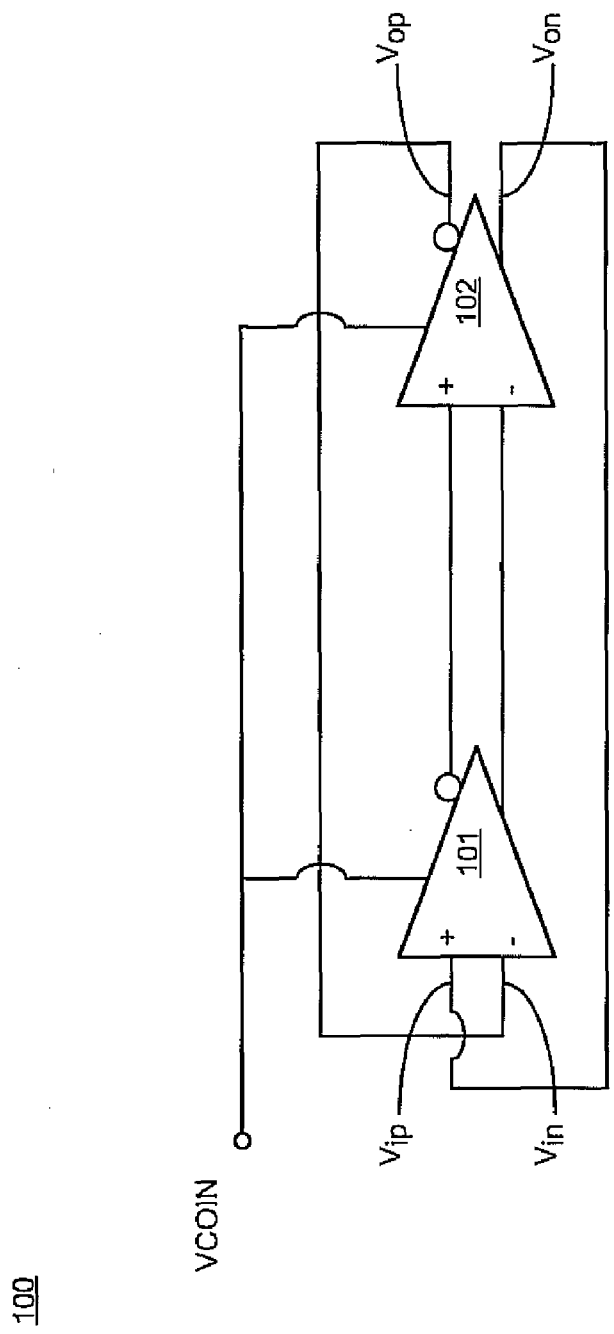
FIG. 1 shows a schematic block diagram of a VCO in accordance with one embodiment of the present invention.

FIG. 1 shows a schematic block diagram of a VCO 100 in accordance with one embodiment of the present invention. VCO 100 illustrates the general scheme of operation of the present invention. VCO 100 is comprised of a two inverters where the output of the first inverter is coupled to the input of the second inverter, and the output of the second inverter is coupled to the input of the first inverter. Each inverter has a positive and a negative input and a corresponding positive and negative output. The first inverter, e.g., inverter 101 of VCO 100 has its outputs coupled to the inputs of the second inverter 102. The outputs of the second inverter 120 are coupled to the inputs of the first inverter 101. The resulting feed back effects an oscillation within VCO 100. The frequency of oscillation is variable over a range. The degree of variation is determined by the application of a control voltage to the circuitry comprising each inverter. Feedback to the inputs Vip and Vin from the outputs Vop and Von sustain the oscillation. The output signal of VCO 100 is typically taken from one or both inverters.

VCO 100 functions by maintaining a stable, predictable, output signal having a frequency which corresponds to an externally applied control voltage VCOIN.

Figure 2:
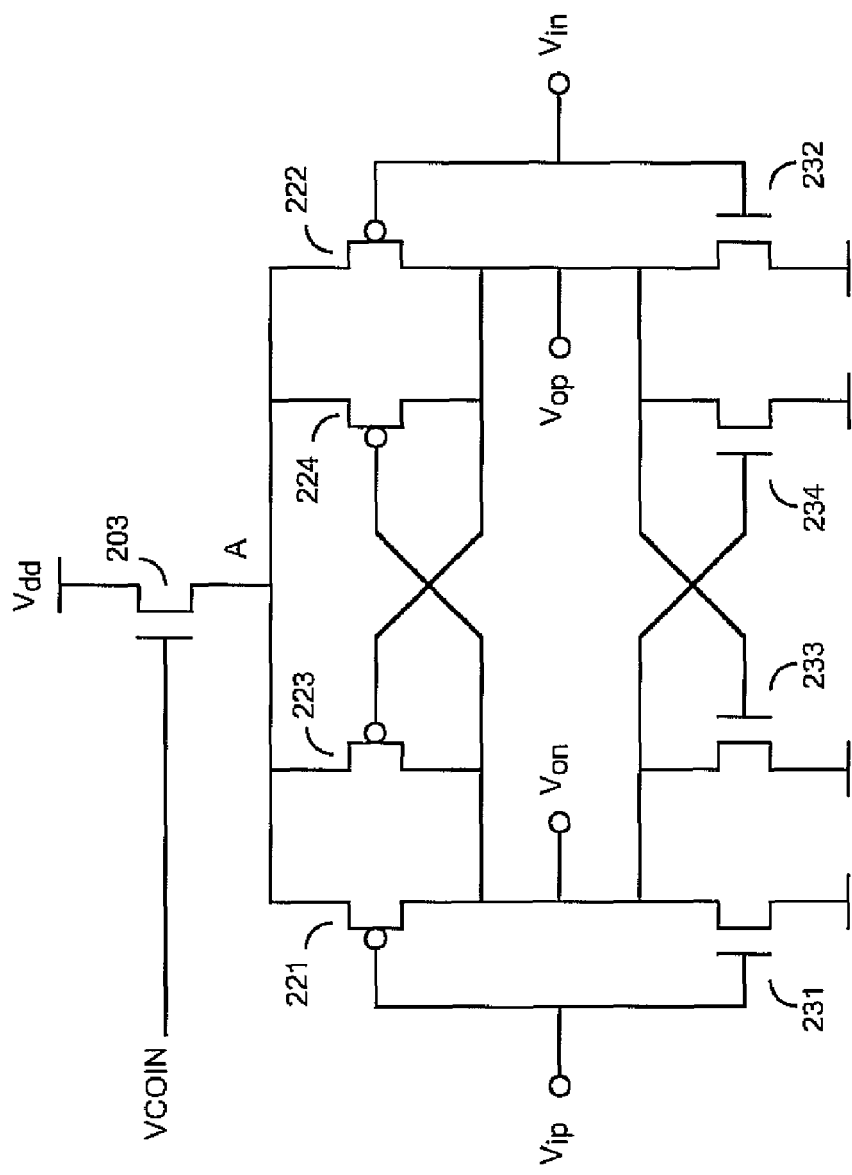
FIG. 2 shows a circuit diagram of the VCO cell from FIG. 1.

FIG. 2 shows the circuit diagram of the VCO cell used in VCO 100. VCO cell 200 includes transistors 221-231 and 222-232 as complementary CMOS inverters and transistors 223-224 and 233-234 as cross-coupled transistors. The cross-coupled transistors do two things. First, they don't let the inverters 221-231 and 222-232 operate independently, and they keep the timing relationship between the inverters with 180 phase difference. Second, they create extra gain and extra phase shift so that the oscillator can oscillate with only 2 stages. Transistors 221, 222, 223 and 224 are all connected to node 'A', and node 'A' is coupled to Vdd through source follower transistor 203. Voltages Vip and Vin are respectively coupled to inverters 221-231 and 222-232. The outputs are taken from nodes Vop and Von. As the VCOIN Moves, node 'A' follows with the same manner with some voltage difference which depends on the type of N transistor used for the source follower and its size and the size of the rest of the transistors and the voltage of VCOIN. The N transistor in the source follower can also be a native device. Since this complementary inverters with cross-coupled transistor has a very high gain, even with low voltage at node 'A' this oscillator can oscillate. Therefore, this oscillator can cover a very wide range, and the fact that it is only a 2 stage VCO, it can operate up to a very high frequency. Also the complementary CMOS architecture with cross-coupled transistors generates sharp-edges while consuming low power. The transistor sizes can be adjusted to get same rise and fall time, and consequently a symmetrical waveform which reduces the phase noise. The source follower will isolate Vdd from node 'A' so it reduces the PSS.

Figure 3A:
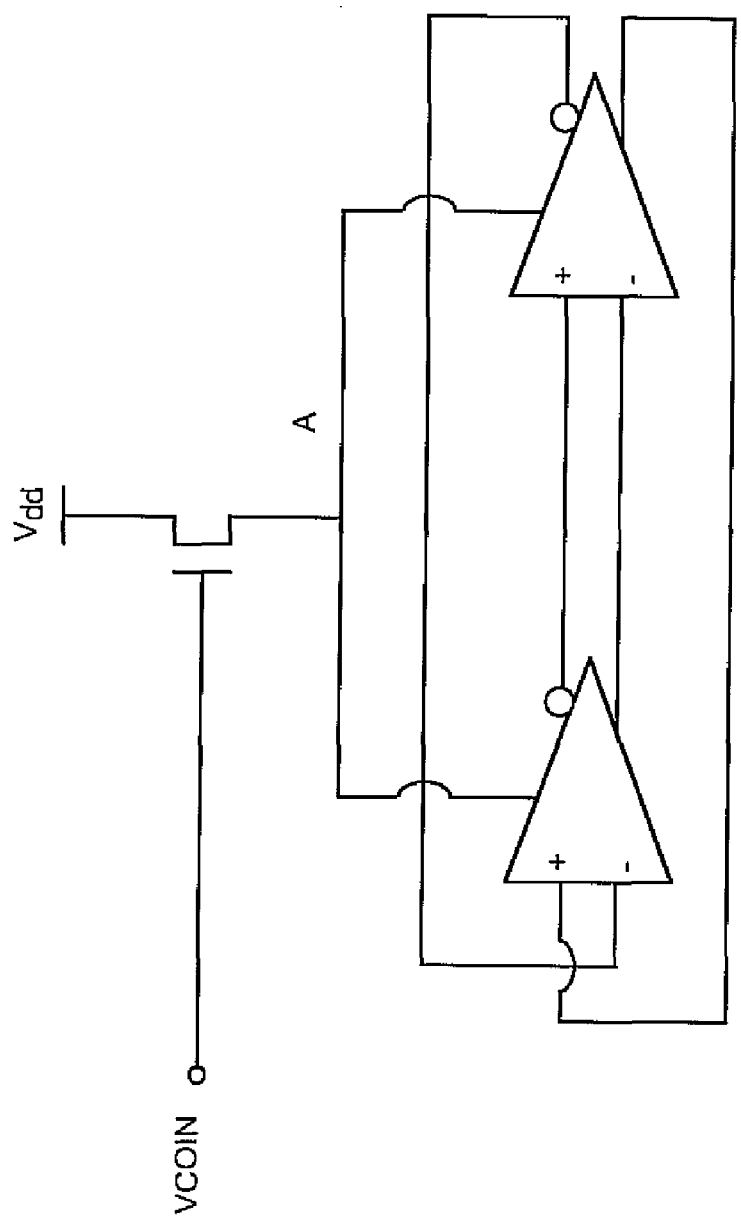
FIG. 3A shows a circuit diagram of a VCO in accordance with an alternate embodiment of the present invention.
Figure 3B:
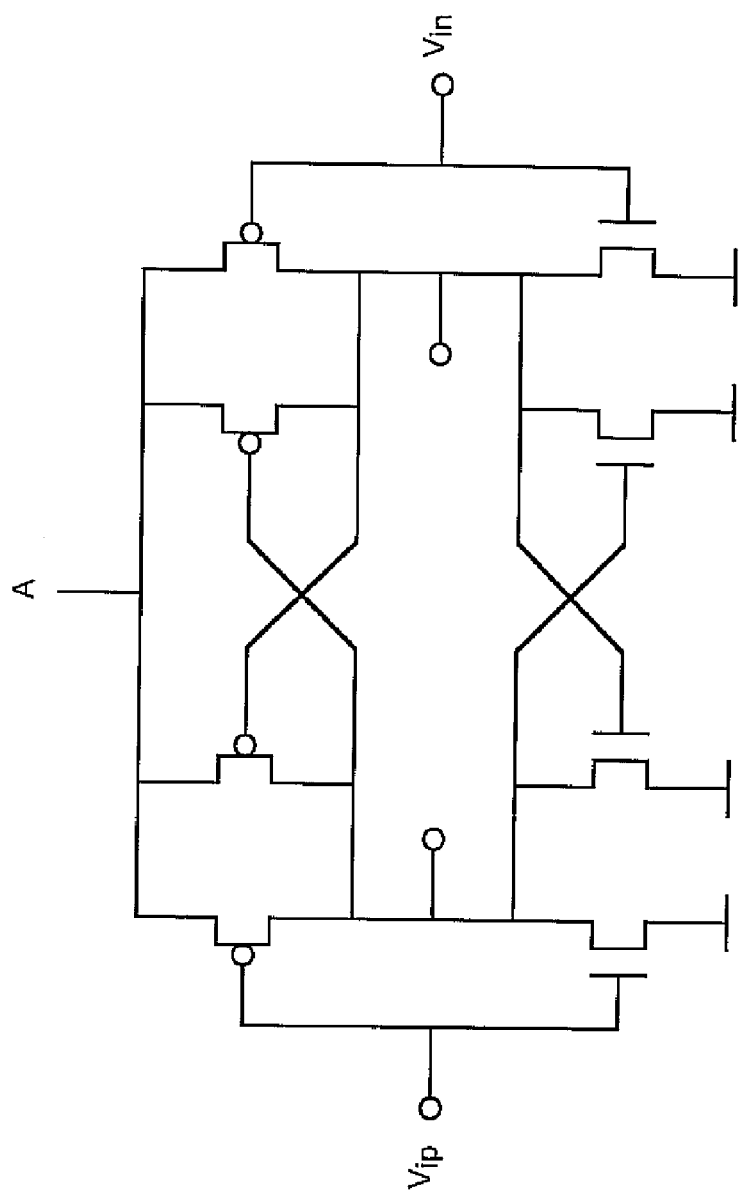
FIG. 3B shows the VCO cell for FIG. 3A.

FIG. 3. shows an alternate VCO with respect to FIG. 1., where node 'A' in both VCO cells are connected together, so the source followers will be in parallel and can be shown as one transistor with 2× size. In this case the VCO cells 311 and 312 will be similar to what is shown in FIG. 3B. The same argument can be applied to this architecture.

It should be noted that the source follower in FIG. 3A can be replaced by a unity gain amplifier. Additionally, it should be noted that each of the above VCOs can be designed with more than 2 stages to provide lower speed and higher power consumption.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A VCO circuit having low jitter, comprising:
a first ring oscillator stage;
a second ring oscillator stage coupled to the first ring oscillator stage; and
at least one native N channel transistor coupled to receive a VCO input and couple the VCO input to the first ring oscillator stage and the second ring oscillator stage for receiving a control voltage;
wherein each of the first ring oscillator stage and the second ring oscillator stage further comprises a CMOS inverter with a plurality of cross coupled transistors to implement high-speed oscillation of the VCO circuit over a wide range.

2. The VCO circuit of claim 1, wherein the plurality of cross coupled transistors is configured to ensure that the VCO will oscillate with 2 stages.

3. The VCO circuit of claim 1, wherein the at least one native N channel transistor comprises two native N channel transistors coupled to each of the first ring oscillator stage and the second ring oscillator stage respectively, the two native N channel transistors configured as source followers whose gates are connected to the VCO input.

4. The VCO circuit of claim 1, wherein each of the first ring oscillator stage and the second ring oscillator stage comprises 4 N-type and 4 P-type transistors which form the CMOS inverters with 2 pairs of cross coupled transistors.

5. The VCO circuit of claim 1, wherein the VCO circuit includes only the first ring oscillator stage and the second ring oscillator stage, and is fabricated in CMOS.

6. The VCO circuit of claim 5, wherein the first ring oscillator stage and the second ring oscillator stage in the fabrication in CMOS is to provide high-speed operation across a wide frequency range and a low power consumption for the VCO circuit.

7. An integrated circuit device, comprising:
a first ring oscillator stage;
a second ring oscillator stage coupled to the first ring oscillator stage; and
at least one native N channel transistor coupled to receive a VCO input and couple the VCO input to the first ring oscillator stage and the second ring oscillator stage for receiving a control voltage;
wherein each of the first ring oscillator stage and the second ring oscillator stage further comprises a CMOS inverter with a plurality of cross coupled transistors to implement high-speed oscillation of a VCO circuit over a wide range.

8. The device of claim 7, wherein the plurality of cross coupled transistors is configured to ensure that the VCO will oscillate with 2 stages.

9. The device of claim 7, wherein the at least one native N channel transistor comprises two native N channel transistors coupled to each of the first ring oscillator stage and the second ring oscillator stage respectively, the two native N channel transistors configured as source followers whose gates are connected to the VCO input.

10. The device of claim 7, wherein each of the first ring oscillator stage and the second ring oscillator stage comprises 4 N-type and 4 P-type transistors which form the CMOS inverters with 2 pairs of cross coupled transistors.

11. The device of claim 7, wherein the VCO circuit includes only the first ring oscillator stage and the second ring oscillator stage, and is fabricated in CMOS.

12. The device of claim 10, wherein the first ring oscillator stage and the second ring oscillator stage in the fabrication in CMOS is to provide high-speed operation across a wide frequency range and a low power consumption for the VCO circuit.

13. A CMOS integrated circuit device, comprising:
a first ring oscillator stage;
a second ring oscillator stage coupled to the first ring oscillator stage; and
at least one native N channel transistor coupled to receive a VCO input and couple the VCO input to both the first ring oscillator stage and the second ring oscillator stage for receiving a control voltage;
wherein each of the first ring oscillator stage and the second ring oscillator stage further comprises a inverter with a plurality of cross coupled transistors to implement high-speed oscillation of a VCO circuit over a wide range.

14. The device of claim 13, wherein the plurality of cross coupled transistors is configured to ensure that the VCO will oscillate with 2 stages.

15. The device of claim 13, wherein the at least one native N channel transistor comprises two native N channel transistors coupled to each of the first ring oscillator stage and the second ring oscillator stage respectively, the two native N channel transistors configured as source followers whose gates are connected to the VCO input.

16. The device of claim 15, wherein each of the first ring oscillator stage and the second ring oscillator stage comprises 4 N-type and 4 P-type transistors which form the inverters with 2 pairs of cross coupled transistors.

17. The device of claim 16, wherein the first ring oscillator stage and the second ring oscillator stage in the fabrication in CMOS is to provide high-speed operation across a wide frequency range and a low power consumption for the VCO circuit.

* * * * *